United States Patent
Chen et al.

(10) Patent No.: US 10,802,573 B2
(45) Date of Patent: Oct. 13, 2020

(54) POWER MANAGEMENT SYSTEM AND METHOD FOR MANAGING POWER

(71) Applicant: Wiwynn Corporation, New Taipei (TW)

(72) Inventors: Kui-Yeh Chen, New Taipei (TW);
Yi-Chen Luo, New Taipei (TW);
Chih-Yuan Hsu, New Taipei (TW);
Wei-Yu Chiang, New Taipei (TW);
Heng-I Chi, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 122 days.

(21) Appl. No.: 16/208,581

(22) Filed: Dec. 4, 2018

(65) Prior Publication Data

US 2020/0103958 A1 Apr. 2, 2020

(30) Foreign Application Priority Data

Oct. 1, 2018 (TW) .............................. 107134637 A

(51) Int. Cl.
*G06F 1/3296* (2019.01)
*G06F 1/3209* (2019.01)
*H05K 7/14* (2006.01)

(52) U.S. Cl.
CPC .......... *G06F 1/3296* (2013.01); *G06F 1/3209* (2013.01); *H05K 7/1492* (2013.01); *H05K 7/1498* (2013.01)

(58) Field of Classification Search
CPC ... G06F 1/3296; G06F 1/3209; H05K 7/1492; H05K 7/1498

USPC ......................................................... 713/320
See application file for complete search history.

(56) References Cited

U.S. PATENT DOCUMENTS

| | | | | |
|---|---|---|---|---|
| 2005/0015531 A1* | 1/2005 | Yabuta | ................ | G06F 13/4027 710/100 |
| 2005/0034000 A1* | 2/2005 | Lee | ............................ | G06F 1/28 713/320 |
| 2009/0125737 A1* | 5/2009 | Brey | ....................... | G06F 1/3203 713/322 |
| 2011/0273833 A1* | 11/2011 | Zhang | ........................ | G06T 1/20 361/679.32 |
| 2012/0166825 A1* | 6/2012 | Blackburn | ............. | G06F 1/3203 713/310 |
| 2013/0246820 A1* | 9/2013 | Branover | ................ | G06F 1/206 713/320 |

(Continued)

OTHER PUBLICATIONS

"Search Report of Europe Counterpart Application", dated Jul. 19, 2019, p. 1-p. 14.

*Primary Examiner* — Paul R. Myers
(74) *Attorney, Agent, or Firm* — JCIPRNET

(57) ABSTRACT

A power management system and a power management method are provided. The power management system includes a host manager and at least one server. The server communicates with the host manager. The server includes at least one processor, at least one voltage regulator, and a voltage regulator controller. The voltage regulator provides an actual power to the corresponding processor. The voltage regulator controller adjusts the actual power provided by the voltage regulator. The host manager controls the voltage regulator controller in the server and uses the voltage regulator controller to adjust the actual power provided by the voltage regulator for managing a power of the processor.

9 Claims, 3 Drawing Sheets

(56) References Cited

U.S. PATENT DOCUMENTS

| | | | |
|---|---|---|---|
| 2014/0075222 A1* | 3/2014 | Jackson | G06F 1/3234 713/320 |
| 2014/0189376 A1* | 7/2014 | Rotem | G06F 1/325 713/300 |
| 2016/0179117 A1* | 6/2016 | Eastep | G05B 15/02 700/291 |
| 2017/0063126 A1* | 3/2017 | Haebler | G01R 21/133 |
| 2017/0097674 A1 | 4/2017 | Tschirhart et al. | |
| 2019/0265776 A1* | 8/2019 | Montero | G06F 1/3206 |

* cited by examiner

POWER MANAGEMENT SYSTEM AND METHOD FOR MANAGING POWER

CROSS-REFERENCE TO RELATED APPLICATION

This application claims the priority benefit of Taiwan application serial no. 107134637, filed on Oct. 1, 2018. The entirety of the above-mentioned patent application is hereby incorporated by reference herein and made a part of this specification.

BACKGROUND OF THE DISCLOSURE

Field of the Disclosure

The disclosure relates to a power management technique for electronic devices, and more particularly, relates to a power management system and a power management method for managing a power of a processor by using a voltage regulator controller to adjust an actual power.

Description of Related Art

Power management is an important function for an electronic device (e.g., a personal computer, a notebook computer, or a server) provided with a processor (e.g., a central processing unit (CPU), or a graphics processing unit). Especially, for a data center provided with multiple servers, power management can save considerable expenses. Each processor is designed and defined with a thermal design power (TDP) and an upper limit threshold for working frequency. With the CPU taken as an example, in order to perform an automatic power management for lowering power consumption, the CPU can adjust working frequency and working voltage of the CPU by using a dynamic voltage scaling (DVS) according to its own workload during operation of the electronic device.

In the existing power management, power consumption can usually be lowered by reducing working frequency and/or power only when workload of the CPU is relatively low. When workload of the CPU is relatively high, because of a power upper limit and a working frequency upper limit of the CPU, the CPU can only operate at full speed according to these upper limits without having other paths to solve the problem of high workload. In other words, in certain cases, it may be necessary to have the server increase its workload within a short period of time. However, in the unusual cases, the current solution can only purchase additional servers to balance the workload instead of improving efficiency by temporarily increase the upper limits of the existing servers.

SUMMARY OF THE DISCLOSURE

The disclosure provides a power management system and a power management method, which are capable of simultaneously setting and adjusting actual powers of the processors in multiple running servers, so as to increase or limit overall power consumption for the servers in real time.

The power management system includes a host manager and a server. The server communicates with the host manager. The server includes a processor, a voltage regulator and a voltage regulator controller. The voltage regulator is coupled to the corresponding processor to provide an actual power to the corresponding processor. The voltage regulator controller is coupled to the voltage regulator, and configured to adjust the actual power provided by the voltage regulator. The host manager controls the voltage regulator controller in the server and uses the voltage regulator controller to adjust the actual power provided by the voltage regulator for managing a power of the processor.

The power management method of the disclosure is adapted for a host manager. The host manager is located in a power management system having a server. The power management method includes the following steps: measuring a plurality of parameters in the server for monitoring the server, wherein the server includes a processor, a voltage regulator and a voltage regulator controller; and controlling the voltage regulator controller, and using the voltage regulator controller to adjust an actual power provided by the voltage regulator for managing a power of the processor.

Based on the above, according to the embodiments of the disclosure, the host manager in the power management system uses the voltage regulator controller in each server to adjust the actual power of each processor so as to manage the power of the processor. Accordingly, the power of the processor may moderately go over the thermal design power or the power of the processor may be reduced to lower overall power consumption. For example, the actual power of the processor may be reduced by the voltage regulator controller using a power-over reporting, or the actual power of the processor may be increased by the voltage regulator controller using an under reporting. In this way, the host manager in the power management system can simultaneously set and adjust the actual powers of the processors in multiple running servers, so as to increase or limit overall power consumption for the servers in real time. In addition, the servers that are configured and already running may achieve the power management of this embodiment without going through a power cycle (e.g., restarting), so as to save processing time.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
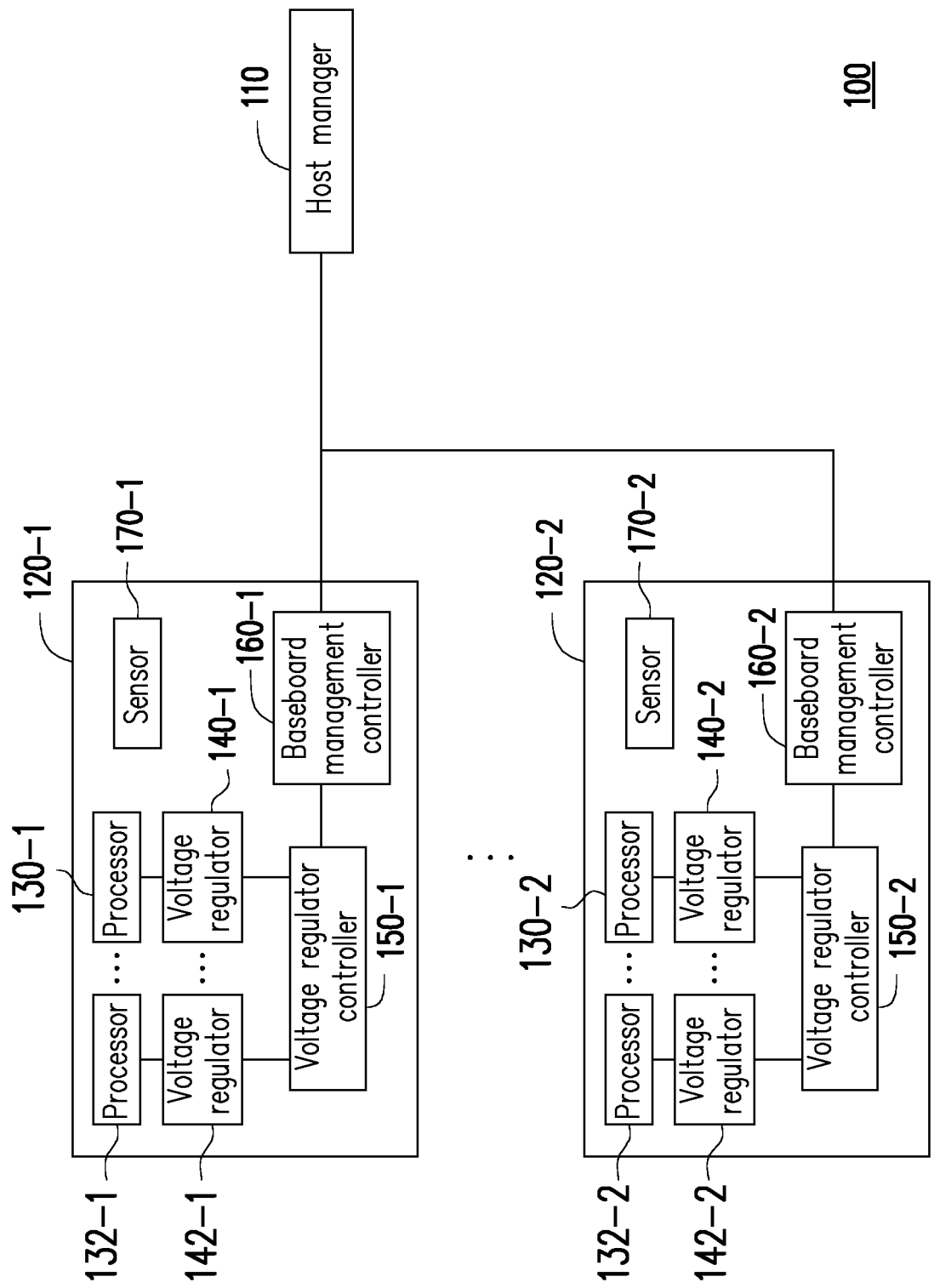
FIG. 1 is a block diagram of a power management system according to an embodiment of the disclosure.

Reference will now be made in detail to the preferred embodiments of the disclosure, examples of which are illustrated in the accompanying drawings. Wherever possible, the same reference numbers are used in the drawings and the description to refer to the same or like parts.

FIG. 1 is a block diagram of a power management system 100 according to an embodiment of the disclosure. The power management system 100 includes a host manager 110 and at least one server (here, the servers 120-1 and 120-2 are taken as an example). The power management system 100 of the embodiment is adapted for a data center provided with a large number of servers. The host manager 110 may be a particular host manager for managing the servers, or may be one of the servers.

An internal structure of the server 120-1 is described as follows. The server 120-1 mainly includes at least one processor (e.g., processors 130-1 and 132-1), a voltage regulator (e.g., a voltage regulator (140-1, 142-1)) corresponding to each processor, and a voltage regulator controller 150-1. The processor in this embodiment takes a central processing unit (CPU) as an example. Those who apply the embodiment may adjust the type of the processor based on actual requirements. For example, a graphics processing unit (GPU) or other type of microprocessor may be used as the processor described in the embodiment of the disclosure. The voltage regulators 140-1 and 142-1 are coupled to the corresponding one of the processors 130-1 and 132-1, respectively. Each of the voltage regulators 140-1 and 142-1 provides an actual power to the corresponding one of the processors 130-1 and 132-1. The voltage regulator controller 150-1 is coupled to each of the voltage regulators (e.g., the voltage regulators 140-1 and 142-1 located in the server 120-1), and configured to adjust the actual power provided to the processor (130-1, 132-1) by the voltage regulator (140-1, 142-1).

The server 120-1 further includes a baseboard management controller 160-1. The baseboard management controller 160-1 in the server 120-1 can communicate with the host manager 110 through a network or other methods. The server 120-1 also includes a sensor 170-1 (in various types), which is coupled to the baseboard management controller 160-1. The sensor 170-1 is configured to measure a plurality of parameters in the server 120-1 (e.g., temperature, power consumption, working voltage and working current of each processor). The baseboard management controller 160-1 transmits the parameters measured by the sensor 170-1 to the host manager 110 for allowing the host manager 110 to monitor the server 120-1.

The server 120-2 has an internal structure similar to that of the server 120-1. That is to say, the server 120-2 includes a processor (130-2, 132-2), a voltage regulator (140-2, 142-2), a voltage regulator controller 150-2, a baseboard management controller 160-2 and a sensor 170-2.

In the embodiments of the disclosure, the number of the processors, the number of the corresponding voltage regulators and the number of the voltage regulator controller in one single server are not particular limited. For example, those who apply the embodiment may dispose only one processor and one corresponding voltage regulator in the server based on actual requirements, and may also dispose two, four or even sixteen processors with the corresponding number of the voltage regulators in the server. The number of the voltage regulator controllers may also be correspondingly adjusted according to the number of the voltage regulators that can be controlled at the same time.

In general, the voltage regulator controller 150-1 located in the server 120-1 aims to allow each processor (130-1, 132-1) to obtain a suitable power. Preferably, the value of the suitable power does not go over a rated power upper limit (i.e., the thermal design power (TDP)) of each processor (130-1, 132-1) which is set as the factory setting. Here, it is assumed that the rated power upper limit of each processor (130-1, 132-1) is 100 W. However, due to different circumstances (materials, power supply loads, etc.) of the voltage regulator (140-1, 142-1), the voltage regulator (140-1, 142-1) may output a power higher than 100 W (e.g., 105 W) to the processor (130-1, 132-1). In that case, the voltage regulator controller 150-1 needs to adjust and reduce the output of the voltage regulator (140-1, 142-1) to be 100 W in order to meet the need of the processor (130-1, 132-1). The processor (130-1, 132-1) performs its own power management by self adjusting working frequency and power consumption according to its own workload. However, the processor (130-1, 132-1) cannot increase its own power consumption limit.

In view of the above, the voltage regulator controller 150-1 can actually increase or decrease an output power of the voltage regulator (140-1, 142-1), moderately. In other words, the actual power obtained by each processor may not be equal to a rated power consumption of the processor set as the factory setting. Therefore, in the embodiments of disclosure, "the voltage regulator controller 150-1 capable of adjusting the output power of the voltage regulator (140-1, 142-1)" is used as a power management performed by the power management system 100 for each of the processors (e.g., the processors 130-1, 132-1, 130-2 and 132-2). In this way, although each processor has its own rated power upper limit, the embodiment can moderately increase the actual power of each processor to be higher than the rated power upper limit. Accordingly, higher work efficiency may be temporarily obtained by the processor to cope with temporary need of the server for higher workload so the possibility of server overload can be reduced by high power consumption (e.g., when the game maker has expected that a lot of people would log on to a new online game or a large number of users would log on to participate an event in a specific period; when it is expected that workload of the server would be increased when an online ordering for popular tickets is made open to the public).

In this embodiment, a maximum value of the actual power may be 105% of the rated power upper limit of each processor. In other words, this embodiment can further increase the rated power upper limit by 5% for moderately adjusting the actual power of each processor and can set a recovery time in a control condition for adjusting the actual power of the processor back to the original rated power upper limit, so as to prevent the processor from being damaged due to the actual power being overly high and an operating time being overly long. In contrast, the embodiment is not intended to limit a range in which the actual power of each processor is reduced because the processor is less likely damaged when the actual power of the processor is lower than the upper rated power upper limit.

On the other hand, the embodiment can also reduce the actual power of each processor to be lower than the rated power upper limit, so as to lower power consumption (e.g., power consumption of the server may be limited during high electricity fee hours; power consumption of the server may be temporarily limited to extend a usage time of a backup power when the backup power is used as a power source in response to temporary power outage or short-term power shortage on a main power source).

Therefore, the host manager 110 of the embodiment can determine whether it is required to set the server to a performance mode (i.e., for increasing the actual power of the processor to be higher than the rated power upper limit) or a power limited mode (i.e., for reducing the actual power of the processor to be lower than the rated power upper limit) according to a plurality of control conditions set by the user. The control conditions and changes on the server corresponding to the control conditions may be set by the user or a manager based on actual requirements. Accordingly, when a special circumstance has occurred (e.g., when it is determined that a control condition has occurred or triggered), the manager can directly use server change control information corresponding to the occurred or triggered control condition predefined by the manager to adjust the servers (120-1, 120-2). In detail, the manager may set the control conditions (e.g., a condition 1, a condition 2 and a condition 3) for the host manager 110 and the predefined server change control info nation to be performed when the control conditions have occurred (a change 1, a change 2 and a change 3). When one of the condition 1 to the condition 3 (e.g., the condition 1) has occurred, the host manager 110 may notify the manager so the manager can have the ability and the right to select one of the changes in the predefined server change control information (e.g., the change 1, the change 2, and the change 3) to make the servers (120-1, 120-2) conduct the corresponding change. The host manager 110 may also directly and immediately select the corresponding one of the change 1, the change 2 and the change 3 to control the server (120-1, 120-2) when one of the condition 1, the condition 2 and the condition 3 has occurred. On the other hand, the host manager 110 may also obtain the status (e.g., workload, power supply status) of each server (120-1, 120-2) according to the parameters corresponding to the server (120-1, 120-2) as transmitted by the baseboard management controller (160-1, 160-2). In this way, whether the server is set to be in the performance mode or the power limited mode may be determined so the host manager 110 can perform the automatic power management on the server (120-1, 120-2).

For example, the user can preset a plurality of first control conditions in the host manager 110 so the host manager 110 can set the server (120-1, 120-2) to be in the performance mode when determining that one of the first control conditions has occurred or triggered. The user may also preset a plurality of second control conditions in the host manager 110 so the host manager 110 can set the server (120-1, 120-2) to be in the power limited mode when determining that one of the second control conditions has occurred or triggered. Moreover, when the host manager 110 determines that the triggered first control condition or the triggered second control condition is completed or canceled, the host manager 110 can also control the voltage regulator controller (150-1, 150-2) to make each voltage regulator (140-1, 142-1, 140-2, 142-2) provide the rated power to each processor (130-1, 132-1, 130-2, 132-2). In addition, the configured and running server (120-1, 120-2) can achieve the power management of the embodiment without going through the power cycle (e.g., restarting), so as to save the processing time.

Figure 2:
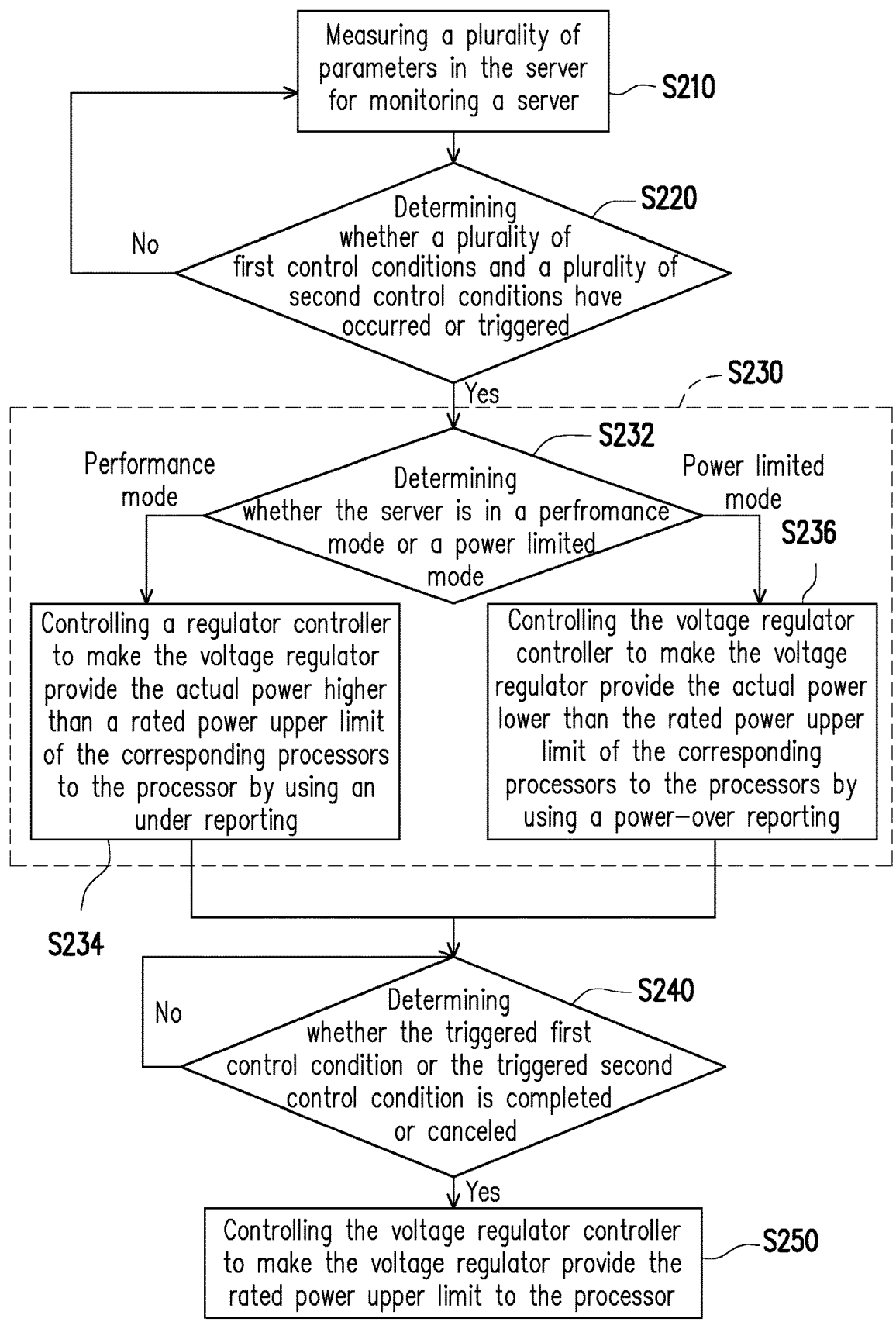
FIG. 2 is a flowchart of a power management method according to an embodiment of the disclosure.

FIG. 2 is a flowchart of a power management method according to an embodiment of the disclosure. The power management method is adapted for the host manager 110 of FIG. 1, and the host manager 110 is located in the power management system 100 that includes the server (120-1, 120-2). Referring to FIG. 1 and FIG. 2 together, in step S210, the host manager 110 uses a sensor (170-1, 170-2) on each server (120-1, 120-2) to measure a plurality of parameters in the server (120-1, 120-2) for monitoring the server (120-1, 120-2).

In step S220, the host manager 110 determines whether a plurality of first control conditions and a plurality of second control conditions are occurred or triggered. In view of the description above, it can be known that, the user or a maintenance staff can preset the first control conditions and the second control conditions in the host manager 110.

When one of the first control conditions and the second control conditions has occurred or triggered, the process moves from step S220 to step S230, in which the host manager 110 controls the corresponding voltage regulator controller (150-1, 150-2) in the server (120-1, 120-2), and uses the voltage regulator controller (150-1, 150-2) to adjust the actual power provided by the voltage regulator (140-1, 142-1, 140-2, 142-2) for managing a power of the processor (130-1, 132-1, 130-2, 132-2). In detail, the host manager 110 can know that the server is in the performance mode or the power limited mode according to a type of the control condition (the first control condition or the second control condition), and may transmit a control command of the corresponding mode to the baseboard management controller (160-1, 160-2). The baseboard management controller (160-1, 160-2) adjusts the actual power provided by the voltage regulator respectively (140-1, 142-1, 140-2, 142-2) according to the control command.

Step S230 may be divided into detailed steps S232, S234 and S236, which are described one by one as follows. In step S232, the host manager 110 uses a plurality of preset first control conditions and a plurality of second control conditions to determine whether the server (120-1, 120-2) is in the performance mode or the power limited mode. Here, it is assumed that, the server 120-1 is determined to be in the performance mode, and the server 120-2 is determined to be in the power limited mode.

When the host manager 110 determines that the server 120-1 is in the performance mode, the process moves from step S232 to step S234, in which the host manager 110 controls the voltage regulator controller 150-1 to make the voltage regulator (140-1, 142-1) provide the actual power (e.g., 135 W) higher than a rated power upper limit (e.g., 120 W) of the corresponding processor (130-1, 132-1) to the processor (130-1, 132-1) by using an under reporting. Accordingly, working frequency of the processor (130-1, 132-1) may be higher than the original preset performance. Although providing the actual power higher than the rated power upper limit to the processors (130-1, 132-1) would increase power consumption, at the same time the processors (130-1, 132-1) can have higher performance without adding additional backup servers in certain cases.

On the other hand, when the host manager 110 determines that the server 120-2 is in the power limited mode, the process moves from step S232 to step S236, in which the host manager 110 controls the voltage regulator controller 150-2 to make the voltage regulator (140-2, 142-2) provide the actual power (e.g., 110 W) lower than the rated power upper limit (e.g., 120 W) of the corresponding processor (130-2, 132-2) to the processor (130-2, 132-2) by using a power-over reporting. In this way, the effect of reducing power consumption can be achieved. In other words, the host manager 110 can directly lower overall power consumption by directly reducing the actual power of the processor (130-2, 132-2) of the server 120-2 through the voltage regulator controller 150-2 such that overall power consumption of the server 120-2 may be directly lowered.

In step S240, when the server (120-1, 120-2) is in the performance mode or the power limited mode, the host manager 110 determines whether the triggered first control condition or the triggered second control condition is completed or canceled. When the triggered first control condition or the triggered second control condition is not completed or canceled, the host manager 110 continuously maintains the server (120-1, 120-2) in the performance mode or the power limited mode, and continuously conducts the determination by step S240. In contrast, when the triggered first control condition or the triggered second control condition is completed or canceled, the process moves from step S240 to step S250, in which the host manager 110 controls the voltage regulator controller (150-1, 150-2) to make the corresponding voltage regulator (140-1, 142-1, 140-2, 142-2) provide the rated power upper limit (i.e., 120 W) to the processor (130-1, 132-1, 130-2, 132-2).

Figure 3:
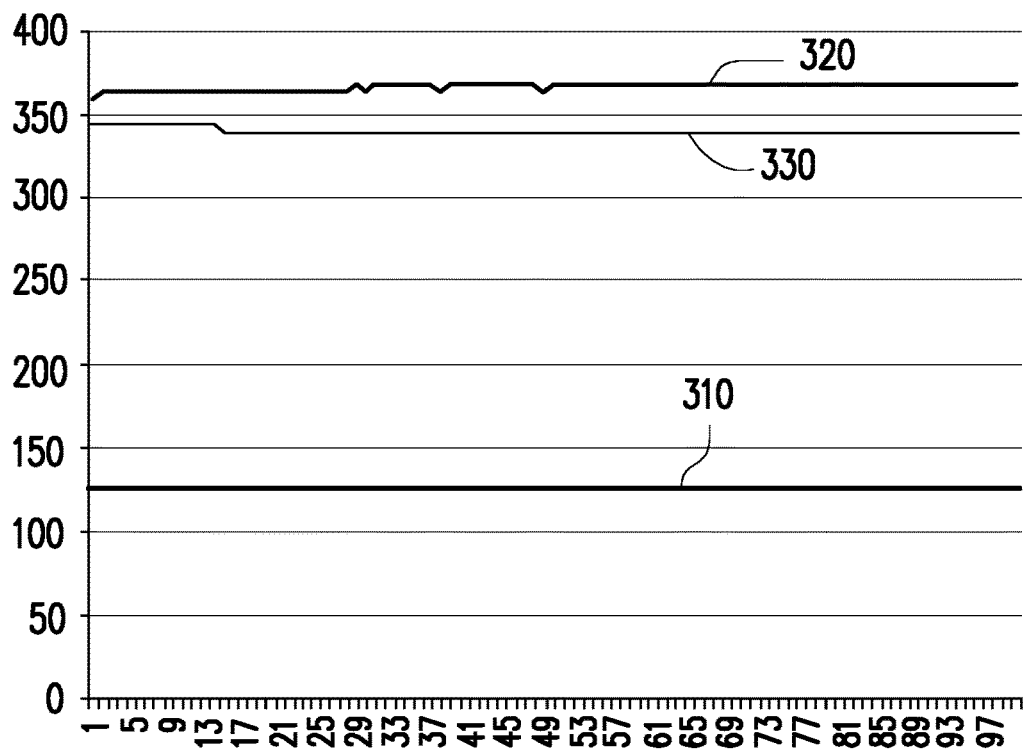
FIG. 3 and FIG. 4 are schematic diagrams showing total power/working frequency when a server 120-1 in FIG. 1 is in a performance mode and when a server 120-2 in FIG. 1 is in a power limited mode, respectively.
Figure 4:
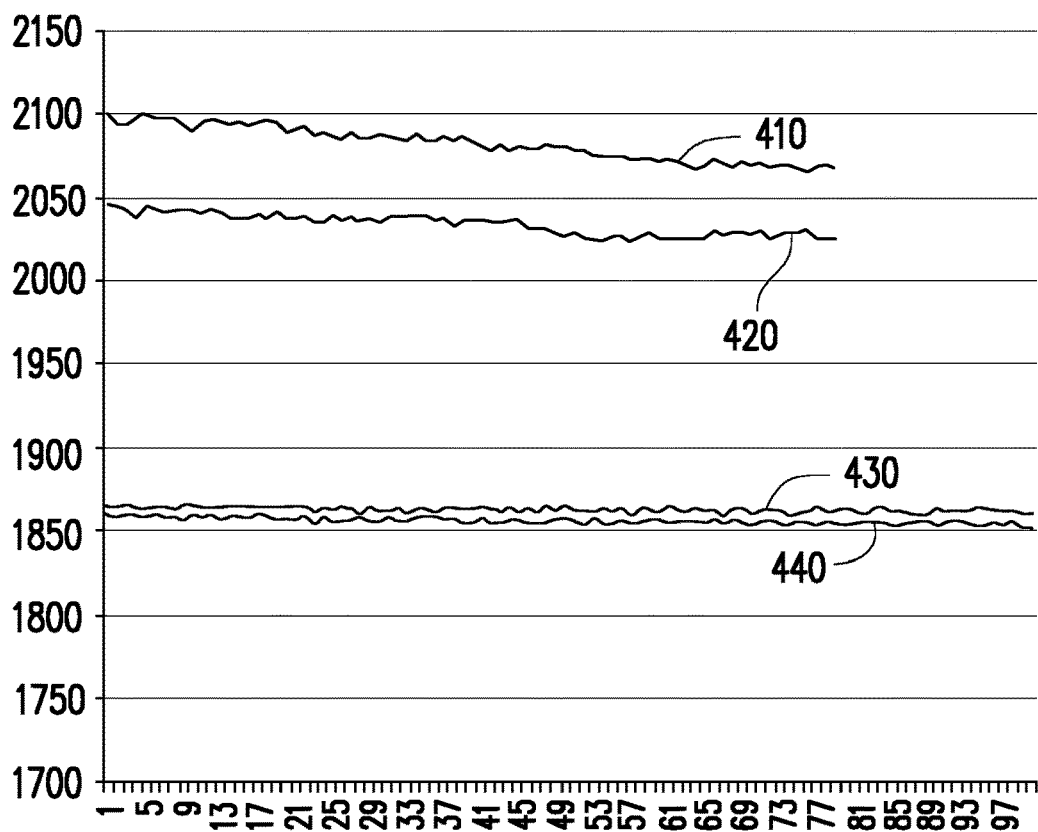

FIG. 3 and FIG. 4 are schematic diagrams showing total power and working frequency when the server 120-1 is in the performance mode and when the server 120-2 is in the power limited mode, respectively. A horizontal axis of FIG. 3 represents time, and a vertical axis of FIG. 3 represents power. As shown by FIG. 3, a line 310 represents power consumption self measured by the processor 130-1 in the server 120-1 and the line 310 also represents power consumption self measured by the processor 130-2 in the server 120-2. In view of FIG. 3, it can be known that the line 310 is at 125 W. Here, by measuring the total power from outside the server 120-1 and the server 120-2, it can be known that, a line 320 is a total power consumption of the server 120-1 in the performance mode and a line 330 is a total power consumption of the server 120-2 in the power limited mode. As can be easily seen from FIG. 3, the total power consumption of the server 120-1 in the performance mode is constantly greater than the total power consumption of the server 120-2 in the power limited mode.

A horizontal axis of FIG. 4 represents time, and a vertical axis of FIG. 4 represents working frequency of the processor. As shown by FIG. 4, a line 410 represents working frequency of the processor 130-1 of the server 120-1 in the performance mode; a line 420 represents working frequency of the processor 132-1 of the server 120-1 in the performance mode; a line 430 represents working frequency of the processor 130-2 of the server 120-2 in the power limited mode; and a line 440 represents working frequency of the processor 132-2 of the server 120-2 in the power limited mode. In view of both FIG. 3 and FIG. 4, it can be known that, while having higher power consumption, the processors 130-1 and 132-1 of the server 120-1 can provide higher working frequency for handling higher workload; and while having lower power consumption, the processors 130-2 and 132-2 of the server 120-2 can provide lower working frequency for saving power.

In summary, according to the embodiments of the disclosure, the host manager in the power management system uses the voltage regulator controller in each server to adjust the actual power of each processor so as to manage the power of the processor. Accordingly, the power of the processor may moderately go over the thermal design power or the power of the processor may be reduced to lower overall power consumption. For example, the actual power of the processor may be reduced by using the power-over reporting of the voltage regulator controller, or the actual power of the processor may be increased by using the under reporting of the voltage regulator controller. In this way, the host manager in the power management system can simultaneously set and adjust the actual powers of the processors in multiple running servers, so as to increase or limit overall power consumption for the servers in real time. In addition, these running servers can be set to achieve the power management of this embodiment without going through a power cycle (e.g., restarting), so as to save the processing time.

It will be apparent to those skilled in the art that various modifications and variations can be made to the structure of the disclosure without departing from the scope or spirit of the disclosure. In view of the foregoing, it is intended that the disclosure cover modifications and variations of the disclosure provided they fall within the scope of the following claims and their equivalents.

What is claimed is:

1. A power management system, comprising:
  a host manager; and
  a server, communicating with the host manager,
  wherein the server comprises:
    a processor;
    a voltage regulator, coupled to the corresponding processor to provide an actual power to the corresponding processor; and
    a voltage regulator controller, coupled to the voltage regulator, and configured to adjust the actual power provided by the voltage regulator,
  wherein the host manager controls the voltage regulator controller in the server and uses the voltage regulator controller to adjust the actual power provided by the voltage regulator for managing a power of the processor,
  wherein the host manager presets a plurality of first control conditions for determining whether the server is in a performance mode, and
  in response to determining that the server is in the performance mode by the host manager, the host manager controls the voltage regulator controller to make the voltage regulator provide the actual power higher than a rated power upper limit of the corresponding processor to the processor by using an under reporting.

2. The power management system according to claim 1, wherein the server further comprises:
  a baseboard management controller, communicating with the host manager through a network,
  wherein the host manager transmits a control command to the baseboard management controller, and the baseboard management controller adjusts the actual power provided by the voltage regulator according to the control command.

3. The power management system according to claim 2, wherein the server further comprises:
  a plurality of sensors, coupled to the baseboard management controller, the plurality of sensors measuring a plurality of parameters in the server,
  wherein the baseboard management controller transmits the parameters measured by the plurality of sensors to the host manager for allowing the host manager to monitor the server.

4. The power management system according to claim 1, wherein a maximum value of the actual power is 105% of the rated power upper limit of the processor.

5. The power management system according to claim 1, wherein the host manager further presets a plurality of second control conditions for determining whether the server is in a power limited mode, and
  in response to determining that the server is in the power limited mode by the host manager, the host manager controls the voltage regulator controller to make the voltage regulator provide the actual power lower than the rated power upper limit of the corresponding processor to the processor by using a power-over reporting.

6. The power management system according to claim 5, wherein when the server is in the performance mode or the power limited mode, the host manager determines whether the triggered first control condition or the triggered second control condition is completed or canceled, and
  in response to determining that the triggered first control condition or the triggered second control condition is completed or canceled by the host manager, the host manager controls the voltage regulator controller to make the voltage regulator provide the rated power upper limit to the processor.

7. A power management method, adapted for a host manager, the host manager is located in a power management system comprising a server, the power management method comprising:
   measuring a plurality of parameters in the server for monitoring the server, wherein the server comprises a processor, a voltage regulator and a voltage regulator controller;
   controlling the voltage regulator controller, and using the voltage regulator controller to adjust an actual power provided by the voltage regulator for managing a power of the processor;
   presetting a plurality of first control conditions for determining whether the server is in a performance mode; and
   in response to determining that the server is in the performance mode, controlling the voltage regulator controller to make the voltage regulator provide the actual power higher than a rated power upper limit of the corresponding processor to the processor by using an under reporting.

8. The power management method according to claim 7, further comprising:
   presetting a plurality of second control conditions for determining whether the server is in a power limited mode; and
   in response to determining that the server is in the power limited mode, controlling the voltage regulator controller to make the voltage regulator provide the actual power lower than the rated power upper limit of the corresponding processor to the processor by using a power-over reporting.

9. The power management method according to claim 8, further comprising:
   when the server is in the performance mode or the power limited mode, determining whether the triggered first control condition or the triggered second control condition is completed or canceled; and
   in response to determining that the triggered first control condition or the triggered second control condition is completed or canceled by the host manager, controlling the voltage regulator controller to make the voltage regulator provide the rated power upper limit to the processor.

* * * * *